United States Patent
Wang et al.

(10) Patent No.: US 7,465,660 B2
(45) Date of Patent: Dec. 16, 2008

(54) GRADED/STEPPED SILICIDE PROCESS TO IMPROVE MOS TRANSISTOR

(75) Inventors: Fuchao Wang, Richardson, TX (US); Ming Fang, Plano, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 858 days.

(21) Appl. No.: 10/424,800

(22) Filed: Apr. 28, 2003

(65) Prior Publication Data
US 2003/0211733 A1 Nov. 13, 2003

Related U.S. Application Data

(62) Division of application No. 09/594,868, filed on Jun. 15, 2000, now Pat. No. 6,350,684.

(51) Int. Cl.
*H01L 21/44* (2006.01)
(52) U.S. Cl. ........................ 438/656; 438/655
(58) Field of Classification Search .......... 438/655, 438/652, 656, 685
See application file for complete search history.

(56) References Cited

U.S. PATENT DOCUMENTS

| 4,954,852 | A | 9/1990 | Lemnios |
| 5,635,765 | A | 6/1997 | Larson |
| 5,654,219 | A | 8/1997 | Huber |
| 5,863,393 | A | 1/1999 | Hu |
| 5,907,784 | A | 5/1999 | Larson |
| 6,087,254 | A * | 7/2000 | Pan et al. ............... 438/659 |
| 6,103,607 | A * | 8/2000 | Kizilayali et al. ........ 438/588 |
| 6,153,452 | A | 11/2000 | Merchant et al. |
| 6,214,711 | B1 | 4/2001 | Hu |
| 6,331,460 | B1 * | 12/2001 | Kizilyalli et al. ........ 438/243 |

FOREIGN PATENT DOCUMENTS

| DE | 198 40 236 A 1 | 7/1999 |
| EP | 0 785 574 A2 | 7/1997 |
| JP | 10303144 | 11/1998 |

* cited by examiner

*Primary Examiner*—Bradley K Smith
(74) *Attorney, Agent, or Firm*—Lisa K. Jorgenson; William A. Munck

(57) ABSTRACT

A silicide having variable internal metal concentration tuned to surface conditions at the interface between the silicide and adjoining layers is employed within an integrated circuit. Higher silicon/metal (silicon-rich) ratios are employed near the interfaces to adjoining layers to reduce lattice mismatch with underlying polysilicon or overlying oxide, thereby reducing stress and the likelihood of delamination. A lower silicon/metal ratio is employed within an internal region of the silicide, reducing resistivity. The variable silicon/metal ratio is achieved by controlling reactant gas concentrations or flow rates during deposition of the silicide. Thinner silicides with less likelihood of delamination or metal oxidation may thus be formed.

8 Claims, 1 Drawing Sheet

GRADED/STEPPED SILICIDE PROCESS TO IMPROVE MOS TRANSISTOR

This application claims priority to U.S. patent application Ser. No. 10/053,109 filed Nov. 2, 2001, which is a division of prior U.S. patent application Ser. No. 09/594,868 filed on Jun. 15, 2000, now U.S Pat. No. 6,350,684.

BACKGROUND OF THE INVENTION

1. Field of the Invention

The present invention relates generally to forming conductive structures within an integrated circuit device, and in particular to forming suicides on conductive structures within an integrated circuit device. Still more particularly, the present invention relates to forming suicides of variable metal concentration as a portion of an integrated circuit device.

2. Background of the Invention

Polysilicon layers are frequently utilized for transistor gates, interconnects, and other conductive structures within integrated circuits. To reduce the resistance of the conductive structure, doped polysilicon is often employed in those applications. While this reduces the resistance of the conductive structure, the sheet resistance remains higher than desired, e.g., between 20 and 40 Ohms/square ($\Omega/\square$). When used as a long distance conductor, the doped polysilicon interconnect may introduce a significant transmission delay.

One method to improve the sheet resistance of doped polysilicon in gate applications that does not require additional masking steps is to combine the polysilicon with a refractory metal. Refractory metal silicide films such as tungsten silicide and titanium silicide are formed on the polysilicon conductive structures (with the resulting silicide often being referred to as a "polycide") in integrated circuits, particularly transistor gates. This process results in an improved sheet resistance, on the order of 1 to 5 Ohms/square. The use of a silicide gate reduces interconnect resistance and allows the gate to be used as a moderate long-distance interconnect. Silicide is also increasingly employed in semiconductor fabrication to reduce the contact resistance to both the gate and the source/drain conductors.

Silicide formation between a silicon and a refractory metal can be accomplished by several means. Silicides may be formed by depositing a refractory metal layer on an existing polysilicon layer, then annealing the two layers at a sufficiently high temperature to form a silicide at the interface. Alternatively, silicides may be deposited through sputter deposition from a refractory metal silicide target or by chemical vapor deposition utilizing gaseous reactants including both the refractory metal and silicon.

In conventional silicide processes, a silicide with a uniform metal concentration or stochimetric ratio (that is, the ratio x/y in $Si_xR_y$ for a silicide formed with refractory metal R) is utilized. However, due to post silicide thermal cycles, such as poly oxidation, annealing steps, and the like, severe problems are known to occur. For example, when the Si/W ratio is low in tungsten silicide, delamination of the silicide from the underlying structure and tungsten oxidation may occur. To overcome these problems, silicon-rich suicides are commonly employed, but result in high resistivities, require large film thickness, provide poor step coverage, and degrade production throughput in both etch and deposition steps. Currently, Si/W ratios of between 2.7 and 3.3—with a resistivity of about 60 $\mu\Omega$-cm—are employed in tungsten silicides as a compromise between sheet resistivity versus delamination and oxidation. As a result, transistor performance, and overall circuit performance, may be limited.

It would be desirable, therefore, to form silicides in integrated circuit devices with low sheet resistance and reduced likelihood of either delamination or metal oxidation.

SUMMARY OF THE INVENTION

A silicide having variable internal metal concentration tuned to surface conditions at the interface between the silicide and adjoining layers is employed within an integrated circuit. Higher silicon/metal (silicon-rich) ratios are employed near the interfaces to adjoining layers to reduce lattice mismatch with underlying polysilicon or overlying oxide, thereby reducing stress and the likelihood of delamination. A lower silicon/metal ratio is employed within an internal region of the silicide, reducing resistivity. The variable silicon/metal ratio is achieved by controlling reactant gas concentrations or flow rates during deposition of the silicide. Thinner silicides with less likelihood of delamination or metal oxidation may thus be formed.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION

The following description details the structure, application and features of the present invention, but the process steps and structures described below do not form a complete process flow for manufacturing integrated circuits. The present invention may be practiced in conjunction with common integrated circuit fabrication techniques, and only so much of the commonly practiced process steps are included as are necessary for an understanding of the present invention. The figures representing cross-sections of portions of an integrated circuit during fabrication are not drawn to scale, but, instead are drawn so as to illustrate the important features of the invention.

Figure 1:
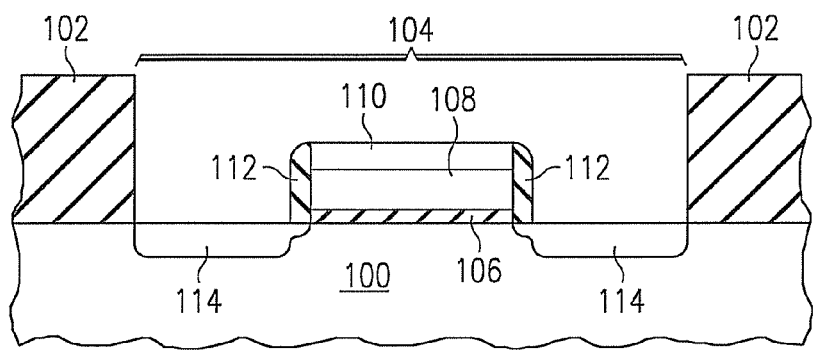
FIG. 1 depicts a cross-section of an integrated circuit structure including a silicide formed in accordance with a preferred embodiment of the present invention.

With reference now to the figures, and in particular with reference to FIG. 1, a cross-section of an integrated circuit structure including a silicide formed in accordance with a preferred embodiment of the present invention is depicted. The process begins with an integrated circuit structure including a substrate 100 on which is formed an isolation oxide 102 having an opening 104 therethrough defining an active region. On a surface of the substrate 100 within the active region is a transistor gate structure including a gate oxide 106 and a polysilicon gate electrode 108. A silicide 110, described in greater detail below, is formed on the gate electrode 108. Sidewall spacers 112 are formed adjacent the gate structure, and source/drain regions 114 are formed within the substrate 100 adjacent the gate structure and partially underlying sidewalls spacers 112.

Each of the structures depicted in FIG. 1, except for silicide 110, may be formed utilizing known processing techniques. To resolve the problems described above, a silicide process with a graded or stepped silicon/refractory metal ratio is employed. Silicide 110 is formed with a variable internal composition in which the ratio of silicon to refractory metal is different at the interfaces between silicide 110 and polysilicon 108 and between silicide 110 and an overlying oxide differs from the ratio of silicon to the refractory metal within a central region.

Ideally, the silicide 110 should have both low sheet resistance and thin thickness. However, suicide delamination during subsequent thermal cycles is more, prevalent among thinner silicide films, and is mainly caused by the presence of interface defects between the underlying polysilicon and the silicide (clean process), and by silicide film stress, typically resulting from lattice mismatch between the silicide and the adjoining layers. Therefore formation of a thin silicide with low sheet resistance is difficult to achieve since increasing refractory metal concentration to reduce resistivity increases stress.

Figure 2:
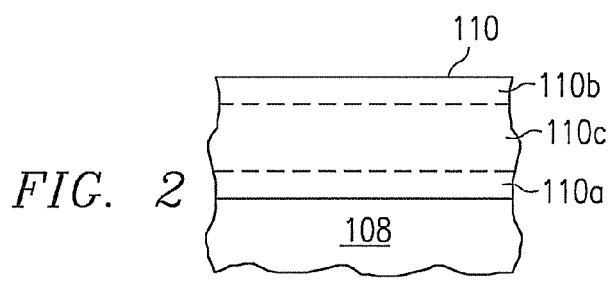
FIG. 2 is a more detailed view of a silicide formed in accordance with a preferred embodiment of the present invention.

Referring to FIG. 2, a more detailed view of a silicide formed in accordance with a preferred embodiment of the present invention is illustrated. Silicide 110 includes different metal concentrations, or silicon/refractory metal ratios, within different regions. A first region 110a near the interface between silicide 110 and the polysilicon gate electrode 108 is silicon-rich, as is a second region 110b near the opposite surface of the silicide layer 110. A central region 110c is less silicon-rich, providing a lower resistivity for the overall structure. The silicon-rich regions near the silicide interfaces reduce the likelihood of delamination, which typically results from lattice mismatch between adjoining layers.

For example, where tungsten silicide is formed, the first and second regions 110a-110b, which preferably have a thickness of less than about 200 Å, may have an Si/W ratio of about 3.3. The central region 110c, which preferably has a thickness of about 900 Å, may have an Si/W ratio of about 2.2. The silicon-rich layers near the interfaces improve lattice mismatch between the silicide 110 and the underlying polysilicon and between the silicide 110 and an overlying oxide (not shown). The central region provides a reduced resistivity for the overall structure, which is all at the same electrical potential such that the electrical properties are not significantly affected by the silicon-rich regions near the interfaces.

Figure 3:
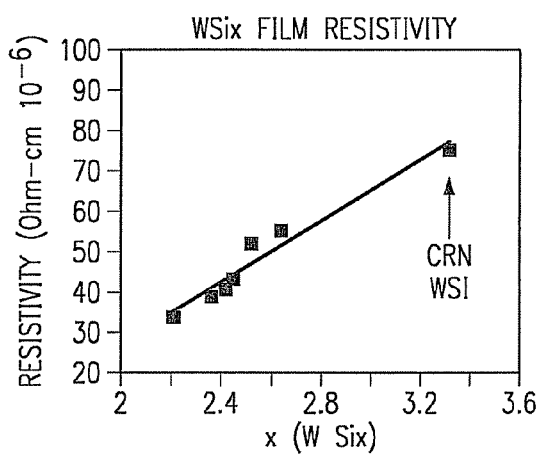
FIG. 3 depicts a plot of resistivity for tungsten silicide layers as a function of the silicon/tungsten ratio.

A plot of resistivity for tungsten silicide layers as a function of the silicon/tungsten (Si/W) ratio x is depicted in FIG. 3.

Figure 4A:
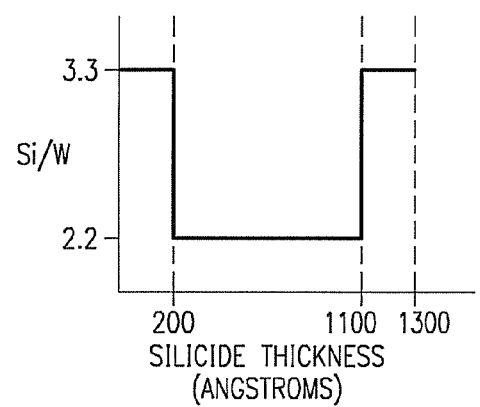
FIGS. 4A-4C are plots of silicon/refractory metal ratios within a silicide layer in accordance with a preferred embodiment of the present invention.
Figure 4B:
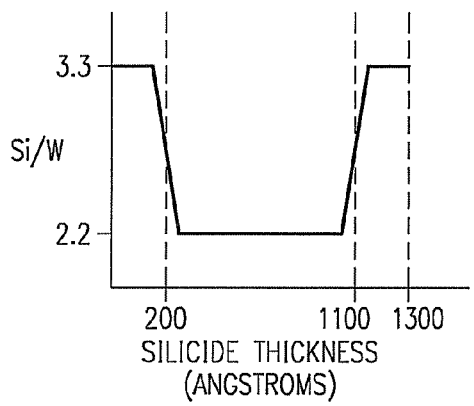
Figure 4C:
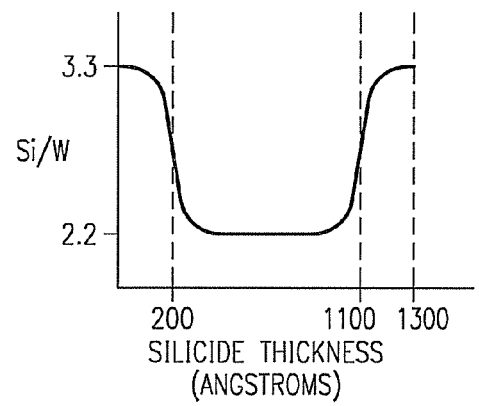

Referring to FIGS. 4A through 4C, plots of silicon/refractory metal ratios within a silicide layer in accordance with a preferred embodiment of the present invention are illustrated. For chemical vapor desposition (CVD) formation of suicides, the ratio of silicon to refractory metal may be controlled by controlling the flow rates of the reactant gases.- Thus, the internal composition of a silicide layer may include step changes in silicon/tungsten ratio a illustrated in FIG. 4A (i.e., formed by distinct layers), gradual changes as illustrated in FIG. 4B, or continuous changes as illustrated in FIG. 4C.

Referring back to FIG. 1, the present invention may be employed with any metal silicide, including titanium silicide, tantalum silicide, or cobalt silicide. The particular stochiometric ratios of silicon to refractory metal within regions 110a and 110b of silicide 110 are preferably tuned to the particular process employed and to the surface conditions of the adjoining layers. Silicide regions 110a and 110b thus act as "glue" layers promoting adhesion between layers, and allowing a thinner silicide 110 to be employed, consistent with smaller device feature sizes.

The present invention allows a reduction of silicide sheet resistivity to increase device performance while also reducing silicide thickness to improve topological step coverage. Thinner silicides improve productivity due to reduced thickness and increase deposition rates, and also reduces the risk of delamination. The poly depletion effect is reduced as a result of lower gate resistivity, and the risk of gate oxide degradation due to flourine penetration is also reduced. Metal oxidation on top of the silicide may be avoided due to the silicon-rich character to the upper surface region.

While the invention has been particularly shown and described with reference to a preferred embodiment, it will be understood by those skilled in the art that various changes in form and detail may be made therein without departing from the spirit and scope of the invention.

What is claimed is:

1. An improved transistor gate structure within an integrated circuit, comprising:
    a gate oxide over a substrate; and
    a gate electrode over the gate oxide, the gate electrode comprising:
        a polysilicon layer; and
        a silicide layer on the polysilicon layer, the silicide layer including a first region at an interface between the silicide layer and the polysilicon layer and having a first silicon/metal ratio, a second region on the first region having a second silicon/metal ratio less than the first silicon/metal ratio, and a third region on the second region having a third silicon/metal ratio greater than the second silicon/metal ratio,
        wherein the silicide layer has gradual changes in silicon/metal ratio across a thickness of the silicide layer.

2. The improved transistor gate structure of claim 1, wherein the suicide layer is a tungsten silicide layer.

3. The improved transistor gate structure of claim 1, wherein the first and third silicide regions each have a thickness of less than about 200 Å and the second silicide region has a thickness of about 900 Å.

4. The improved transistor gate structure of claim 1, wherein the first and third silicide regions each have a silicon/metal ratio of 3.3 and the second silicide region has a silicon metal ratio of 2.2.

5. An improved transistor gate structure within an integrated circuit, comprising:
   a gate oxide over a substrate; and
   a gate electrode over the gate oxide, the gate electrode comprising:
   a polysilicon layer; and
   a silicide layer on the polysilicon layer, the silicide layer including a first region at an interface between the silicide layer and the polysilicon layer and having a first silicon/metal ratio, a second region on the first region having a second silicon/metal ratio less than the first silicon/metal ratio, and a third region on the second region having a third silicon/metal ratio greater than the second silicon/metal ratio,
   wherein the silicide layer has continuous changes in silicon/metal ratio across a thickness of the silicide layer.

6. The improved transistor gate structure of claim 5, wherein the silicide layer is a tungsten silicide layer.

7. The improved transistor gate structure of claim 5, wherein the first and third silicide regions each have a thickness of less than about 200 Å and the second silicide region has a thickness of about 900 Å.

8. The improved transistor gate structure of claim 5, wherein the first and third silicide regions each have a silicon/metal ratio of 3.3 and the second silicide region has a silicon metal ratio of 2.2.

* * * * *